(12) United States Patent
Zhong et al.

(10) Patent No.: US 11,557,580 B2
(45) Date of Patent: Jan. 17, 2023

(54) METHOD AND DEVICE FOR MASS TRANSFER OF MICRO SEMICONDUCTOR ELEMENTS (71) Applicant: XIAMEN SANAN OPTOELECTRONICS TECHNOLOGY CO., LTD., Xiamen (CN)

(72) Inventors: Zhibai Zhong, Xiamen (CN); Chia-En Lee, Xiamen (CN); Jinjian Zheng, Xiamen (CN); Jiansen Zheng, Xiamen (CN); Chen-Ke Hsu, Xiamen (CN); Junyong Kang, Xiamen (CN)

(73) Assignee: Xiamen Sanan Optoelectronics Technology Co., Ltd., Fujian (CN)

( * ) Notice: Subject to any disclaimer, the term of this patent is extended or adjusted under 35 U.S.C. 154(b) by 0 days.

(21) Appl. No.: 17/447,325

(22) Filed: Sep. 10, 2021

(65) Prior Publication Data
US 2021/0407978 A1  Dec. 30, 2021

Related U.S. Application Data

(63) Continuation of application No. 15/929,677, filed on May 15, 2020, now Pat. No. 11,127,723, which is a continuation-in-part of application No. PCT/CN2018/087801, filed on May 22, 2018.

(30) Foreign Application Priority Data

Nov. 20, 2017 (CN) .......................... 201711153705.7

(51) Int. Cl.
*H01L 33/00* (2010.01)
*H01L 25/16* (2006.01)
(52) U.S. Cl.
CPC ........ *H01L 25/167* (2013.01); *H01L 33/0093* (2020.05); *H01L 33/0095* (2013.01)
(58) Field of Classification Search
None
See application file for complete search history.

(56) References Cited

U.S. PATENT DOCUMENTS 10,854,779 B2 * 12/2020 Zou .................. H01L 24/83
10,944,023 B2 *  3/2021 Zou .................. H01L 33/0095

\* cited by examiner

*Primary Examiner* — Bradley Smith
(74) *Attorney, Agent, or Firm* — Rosenberg, Klein & Lee (57) ABSTRACT

A mass transfer method includes providing a transfer unit and a semiconductor carrying unit connected therewith, removing an element supporting structure of the semiconductor carrying unit from micro semiconductor elements of the semiconductor carrying unit, partially removing the photosensitive layer to form connecting structures, connecting a package substrate with electrodes of the micro semiconductor elements, breaking the connecting structures to separate the micro semiconductor elements from the transfer substrate. A mass transfer device is also disclosed.

20 Claims, 5 Drawing Sheets

METHOD AND DEVICE FOR MASS TRANSFER OF MICRO SEMICONDUCTOR ELEMENTS

CROSS-REFERENCE TO RELATED APPLICATION

This application is a continuation application of U.S. patent application Ser. No. 15/929,677, which is a bypass continuation-in-part application of International Application No. PCT/CN2018/087801 filed on May 22, 2018, which claims priority of Chinese Patent Application No. 201711153705.7 filed on Nov. 20, 2017. The entire content of each of the U.S., international, and Chinese patent applications is incorporated herein by reference.

FIELD

The disclosure relates to a method and a device for mass transfer of semiconductor elements, and more particularly to a method and a device for mass transfer of micro semiconductor elements.

BACKGROUND

Technology involving micro semiconductor elements is directed to an array of micro-sized semiconductor elements distributed at a high density on a substrate. Particularly, technology involving micro light emitting diodes (microLEDs) has been the focus in the industry, and high-quality products composed of micro semiconductor elements are expected to become available in the market. Indeed, high-quality microLEDs will have a great impact on conventional display devices such as LCD (liquid-crystal display) devices and OLED (organlc light-emitting diode) display devices.

During the production of micro semiconductor elements, such elements are formed on a donor substrate first, and then are transferred to a receiver substrate (such as a package substrate, a display panel substrate and so forth). However, the transfer to the receiver substrate incurs some difficulties.

Conventionally, transfer of micro semiconductor elements from a donor substrate to a receiver substrate is conducted using a transfer substrate through wafer bonding, and includes direct transfer and indirect transfer. Regarding the direct transfer, an array of micro semiconductor elements placed on a transfer substrate is bonded to and hence directly transferred to a receiver substrate, and the transfer substrate is subsequently removed through a lift-off process or an etching process such that a portion of the epitaxial structure of each micro semiconductor element is usually sacrificed undesirably. Turning to the indirect transfer, an array of micro semiconductor elements placed on a transfer substrate is picked up by a transfer means (such as an elastomeric stamp), the transfer means is then brought to a receiver substrate so as to bond the picked-up array of micro semiconductor elements to the receiver substrate, and the transfer means is detached. The transfer means needs to be resistant to a high temperature.

Four major conventional techniques applied in transfer of micro semiconductor elements involve Van der Waals force, electrostatic adsorption, phase change transition, and laser ablation, respectively. In particular, van der Waals force, electrostatic adsorption, and laser ablation are more frequently applied. Nevertheless, the four conventional techniques have pros and cons.

During semiconductor packaging, polymers having high elasticity and easy processability are commonly used, and may be in a solid form at room temperature after being spin-coated. For instance, a polymer material may be injected into a mold so as to form micro pillars after curing. Such micro pillars can be employed to pick up micro semiconductor elements through a positioning technique, and may be broken by a mechanical force after transfer of the micro semiconductor elements. However, the micro semiconductor elements cannot be massively transferred by the micro pillars at a satisfactory success rate when the positioning technique cannot achieve high precision.

Thus, there is still a need to develop a method for mass transfer of micro semiconductor elements which can more easily achieve a satisfactory success rate of transfer.

SUMMARY

Therefore, an object of the disclosure is to provide a method and a device for mass transfer of micro semiconductor elements, which can alleviate at least one of the drawbacks of the prior art.

The method includes:
providing a transfer unit and a semiconductor carrying unit connected with the transfer unit, the transfer unit including a transfer substrate and a photosensitive layer disposed on the transfer substrate, the photosensitive layer being partially removable, the semiconductor carrying unit including an array of micro semiconductor elements and an element supporting structure that supports the micro semiconductor elements, each of the micro semiconductor elements having a semiconductor layer and at least one electrode disposed on the semiconductor layer opposite to the photosensitive layer, and interconnecting the transfer unit and the element supporting structure in a manner that the semiconductor layer adheres to the photosensitive layer and the electrode is connected to the element supporting structure;
removing the element supporting structure from the micro semiconductor elements;
partially removing the photosensitive layer so that remaining portions of the photosensitive layer respectively correspond in position to the micro semiconductor elements and serve as connecting structures, each of which interconnects a respective one of the micro semiconductor elements and the transfer substrate, a width of at least one part of each of the connecting structures being smaller than a width of an upper surface of the semiconductor layer of a corresponding one of the micro semiconductor elements, the upper surface of the semiconductor layer facing away from the corresponding one of the connecting structures;
connecting a package substrate with the electrodes of the micro semiconductor elements; and
breaking the connecting structures so as to separate the micro semiconductor elements from the transfer substrate.

The device includes:
a transfer substrate;
an array of connecting structures; and
an array of micro semiconductor elements, each of which has a semiconductor layer and at least one electrode disposed on the semiconductor layer,
wherein each of the connecting structures interconnects a respective one of the micro semiconductor elements and the transfer substrate, the electrode being disposed on the respective semiconductor layer opposite to a corresponding one of the connecting structures, a width of at least one part of each of the connecting structures being smaller than a width of an upper surface of the semiconductor layer of a corresponding one of the micro semiconductor elements, the upper surface of the semiconductor layer facing away from the corresponding one of the connecting structures.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
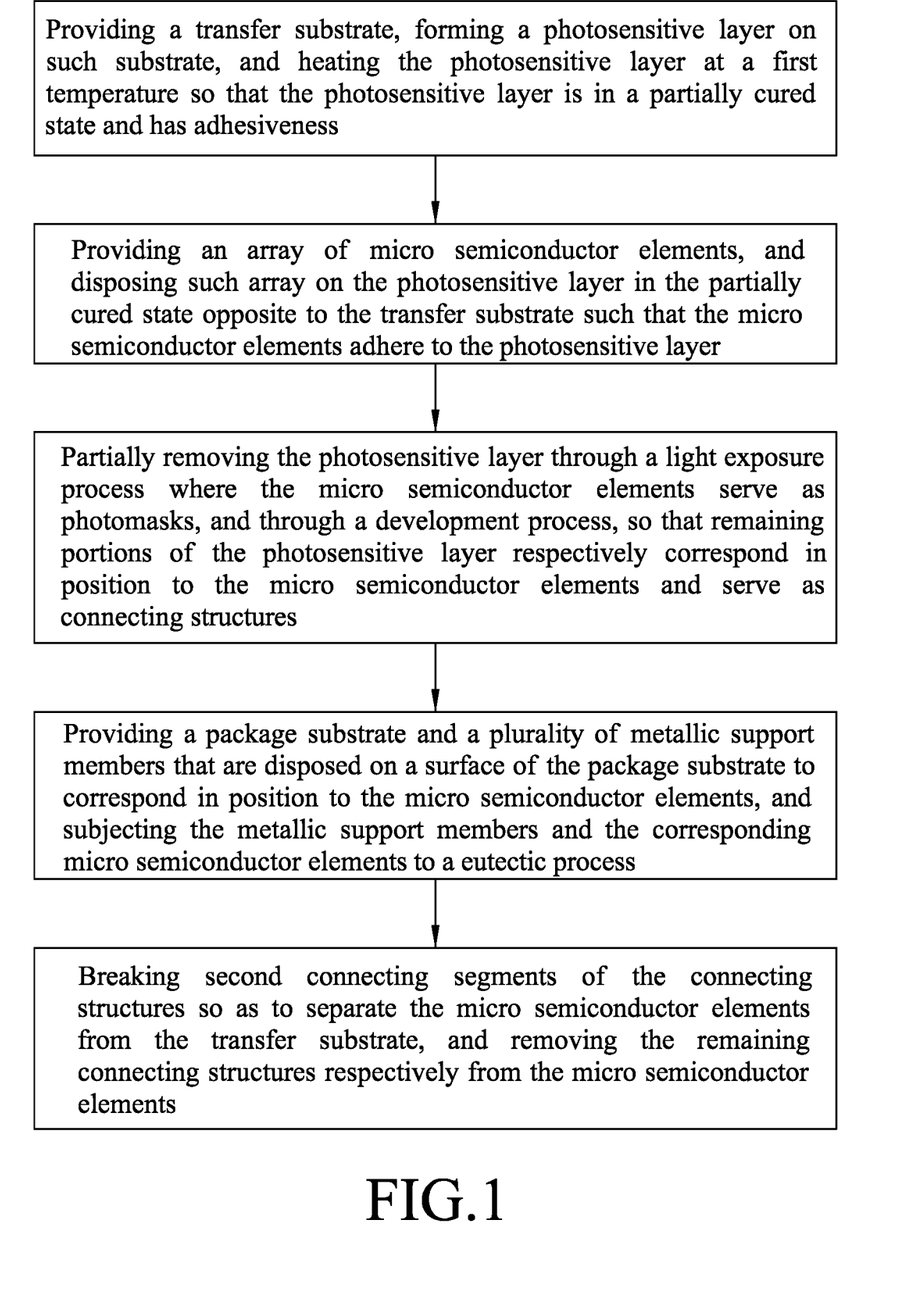
FIG. 1 is a flow chart illustrating steps 1 to 5 in an embodiment of a method for mass transfer of micro semiconductor elements according to the present disclosure.

Referring to FIG. 1, an embodiment of a method for mass transfer of micro semiconductor elements according to the present disclosure includes steps 1 to 5.

Figure 2:
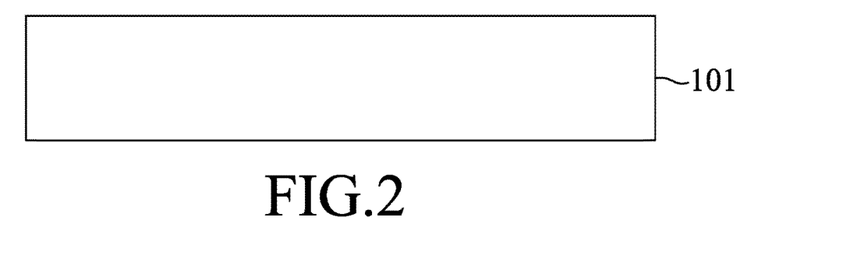
FIGS. 2 and 3 are schematic sectional views illustrating step 1 of the embodiment.
Figure 3:
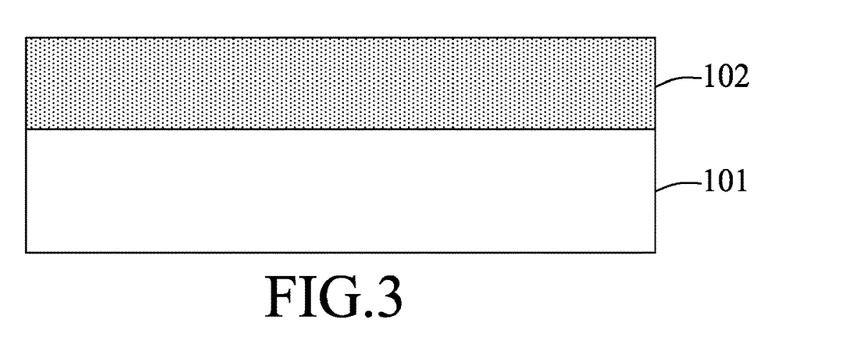

In step 1, a transfer substrate 101 is provided (see FIG. 2), and a photosensitive layer 102 is formed on a surface of the transfer substrate 101 (see FIG. 3). The transfer substrate 101 and the photosensitive layer 102 together constitute a transfer unit. Further, the photosensitive layer 102 is heated at a first temperature, so that the photosensitive layer 102 is in a partially cured state and has adhesiveness. In this embodiment, the photosensitive layer 102 is half-cured. The first temperature is lower than a second temperature (i.e. a fully curable temperature) at which the photosensitive layer 102 is fully curable.

The transfer substrate 101 may be selected from a glass substrate, a ceramic substrate, a polymer substrate, a silicon-based substrate, and a sapphire substrate. In this embodiment, the transfer substrate 101 is a glass substrate that can sufficiently adhere to the photosensitive layer 102 to prevent undesired separation therefrom in subsequent processing. Furthermore, compared to other substrates such as sapphire and silicon-based substrates, use of a glass substrate can reduce the cost.

In a variation of this embodiment, the transfer substrate 101 may be a polymer substrate that has a lower reflectance compared to the photosensitive layer 102. Based on such lower reflectance, the transfer substrate 101 can be more effectively prevented from undesirably reflecting light during a light exposure process conducted in step 3 as described below. Therefore, the photosensitive layer 102 can be prevented from undergoing undesired photo-induced cross-linking, ensuring that connecting structures 106 can be later formed with a desired configuration in step 3 as described below.

The photosensitive layer 102 may be made from a photosensitive material. Examples of such material include, but are not limited to, poly(methyl methacrylate) (PMMA), polydimethylsiloxane (PDMS), polyimide (PI), and combinations thereof. The second temperature for fully curing the photosensitive layer 102 may range from 150° C. to 250° C. Accordingly, the first temperature for partially curing (half-curing in this embodiment) the photosensitive layer 102 may range from 60° C. to 140° C. (for instance, the first temperature may be 60° C., 80° C., 100° C., 120° C., or 70° C. to 110° C.) to ensure that the photosensitive layer 102 has adhesiveness. When the photosensitive layer 102 is heated at the first temperature of 70° C. to 110° C., the heating time may range from 1 to 10 minutes. As long as the photosensitive material, when in the partially cured state (the half-cured state in this embodiment), can have adhesiveness, other alternatives of the photosensitive material may be used.

Figure 4:
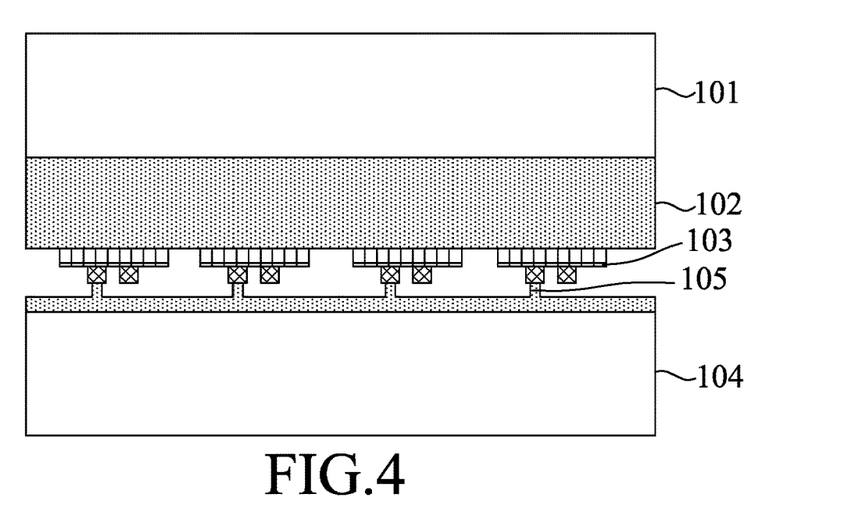
FIGS. 4 and 5 are schematic sectional views illustrating step 2 of the embodiment.

In step 2, as shown in FIG. 4, an array of micro semiconductor elements 103 is disposed on the photosensitive layer 102 in the partially cured state opposite to the transfer substrate 101, such that the micro semiconductor elements 103 adhere to the photosensitive layer 102 based on the adhesiveness of the photosensitive layer 102. Namely, the micro semiconductor elements 103 are picked up by the photosensitive layer 102 in step 2.

The term "array" refers to any arrangement of at least two micro semiconductor elements, whether in one or more regularly-spaced or irregularly-spaced strings, or in a geometric or empirically placed "best practical location" arrangement.

Exemplary micro semiconductor elements include, but are not limited to, micro light-emitting elements such as micro light-emitting diodes (micro LEDs), micro photo-diodes, micro metal oxide semiconductors (MOS), microelectromechanical systems (MEMS), micro semiconductor laser diodes, micro transistors, micro solid-state image sensing devices, micro light emitters and receivers for photo-couplers, microprocessor units, micro integrated circuits, micro thyristors, and combinations thereof. In this embodiment, the micro semiconductor elements 103 are micro LEDs.

In this embodiment, the micro semiconductor elements 103 are disposed on the photosensitive layer 102 using an element supporting structure that supports the micro semiconductor elements 103 and places the micro semiconductor elements 103 toward the photosensitive layer 102. With the element supporting structure, the photosensitive layer 102 having adhesiveness can more easily pick up the micro semiconductor elements 103. The micro semiconductor elements 103 and the element supporting structure together constitute a semiconductor carrying unit.

Specifically, the element supporting structure includes a supporting layer 104, a plurality of stabilization posts 105 that protrude away from the support layer 104, and a connecting layer that interconnects the supporting layer 104 and the stabilization posts 105, and that is made from the same material as that of the stabilization posts 105. The micro semiconductor elements 103 are respectively disposed on the stabilization posts 105 opposite to the support layer 104, and hence can be respectively supported by the stabilization posts 105. It should be noted that the stabilization posts 105 may be dimensioned to have a desired small size for facilitating picking up of the micro semiconductor elements 103 by the photosensitive layer 102, as long as the stabilization posts 105 can stably support the micro semiconductor elements 103.

Optionally, after the micro semiconductor elements 103 adhere to (i.e. are picked up by) the photosensitive layer 102, the photosensitive layer 102 in the partially cured state may be further heated to be further cured, so that the adhesion strength between the micro semiconductor elements 103 and the photosensitive layer 102 is enhanced. The further heating of the photosensitive layer 102 in the partially cured state may be a soft baking process.

Figure 5:
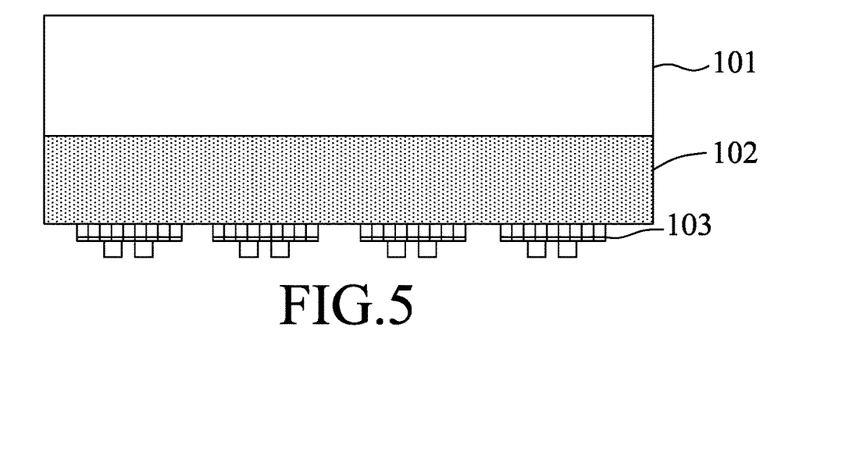

Further in step 2, as shown in FIG. 5, the element supporting structure is removed from the micro semiconductor elements 103. Specifically, such removal can be achieved by exerting a suitable force to only separate the element supporting structure from the micro semiconductor elements 103, or by rendering the adhesion strength between the micro semiconductor elements 103 and the photosensitive layer 102 stronger than the connection strength between the micro semiconductor elements 103 and the stabilization posts 105.

Figure 6:
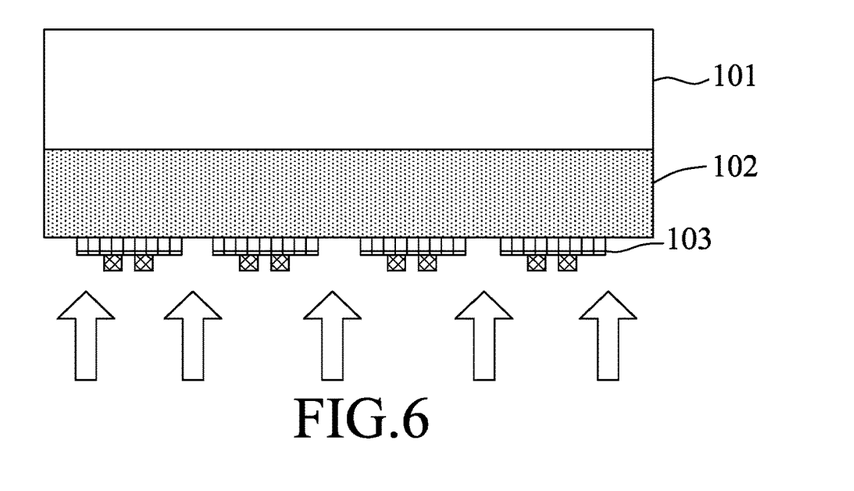
FIGS. 6 and 7 are schematic sectional sectional views illustrating step 3 of the embodiment.
Figure 7:
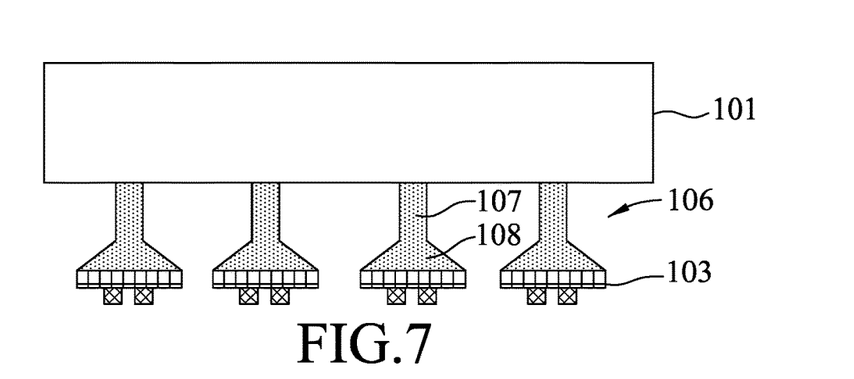

In step 3, the photosensitive layer 102 is partially removed through a light exposure process where the micro semiconductor elements 103 serve as photomasks (see FIG. 6), and through a development process (see FIG. 7), so that remaining portions of the photosensitive layer 102 respectively correspond in position to the micro semiconductor elements 103 and serve as connecting structures 106 (see FIG. 7). Each of the connecting structures 106 interconnects a respective one of the micro semiconductor elements 103 and the transfer substrate 101. Each of the connecting structures 106 has a first connecting segment 108 that extends from the respective one of the micro semiconductor elements 103 toward the transfer substrate 101 in a first direction, and a second connecting segment 107 that extends from the first connecting segment 108 to the transfer substrate 101 in the first direction. The second connecting segment 107 is not larger in width in a second direction than the corresponding semiconductor layer. The second direction being transverse to the first direction.

The second connecting segment 107 is not larger in width than the first connecting segment 108. In this embodiment, the second connecting segment 107 is smaller in average width than the first connecting segment 108.

Specifically, in this embodiment, by controlling the parameters of the light exposure process and/or the development process, the first connecting segment 108 of the respective connecting structure 106 formed after the development process has a trapezoidal section for increasing the contact area between the first connecting segment 108 and the corresponding micro semiconductor element 103, and the second connecting segment 107 of the respective connecting structure 106 formed after the development process is a pillar for facilitating separation of the corresponding micro semiconductor element 103 from the transfer substrate 101. Since the adjustable parameters of the light exposure process and the development process (e.g. light exposure intensity, the angle of incidence light, the light sensitivity of the photosensitive layer 102, the concentration of an aqueous developer, etc.) are well-known to those skilled in the art, the details thereof are omitted herein for the sake of brevity.

For each of the connecting structures 106, the trapezoidal section of the first connecting segment 108 has a narrow base that is connected to the second connecting segment 107, and a wide base that is opposite to the narrow base and connected to a corresponding one of the micro semiconductor elements 103, and that is wider than the narrow base. The width of the second connecting segment 107 is not larger than the narrow base of the trapezoidal section of the corresponding first connecting segment 108. The width of the pillar configuration of the second connecting segment 107 is not smaller than a minimally required width for securely interconnecting the transfer substrate 101 and the respective first connecting segment 108 (i.e. for securely interconnecting the transfer substrate 101 and the respective micro semiconductor element 103). Such secure interconnection means that the respective micro semiconductor element 103 can be prevented from undesired displacement and shaking.

The minimally required width for the second connecting segment 107 may be one third of the width of the corresponding micro semiconductor element 103, and may be, for example, at least 2 μm.

In this embodiment, the photosensitive layer 102 is exposed to ultraviolet light in the light exposure process, so that the ultraviolet light travels perpendicularly relative to and strikes the photosensitive layer 102 (see FIG. 6) to have the first connecting segments 108 of the connecting structures 106 respectively connected to the second connecting segments 107 of the connecting structures 106 in a symmetric manner after the development process (see FIG. 7), i.e. to prevent the micro semiconductor elements 103 from being insecurely connected by the connecting structures 106. To be exact, the ultraviolet light perpendicularly enters the photosensitive layer 102 via spaces among the micro semiconductor elements 103.

Figure 8:
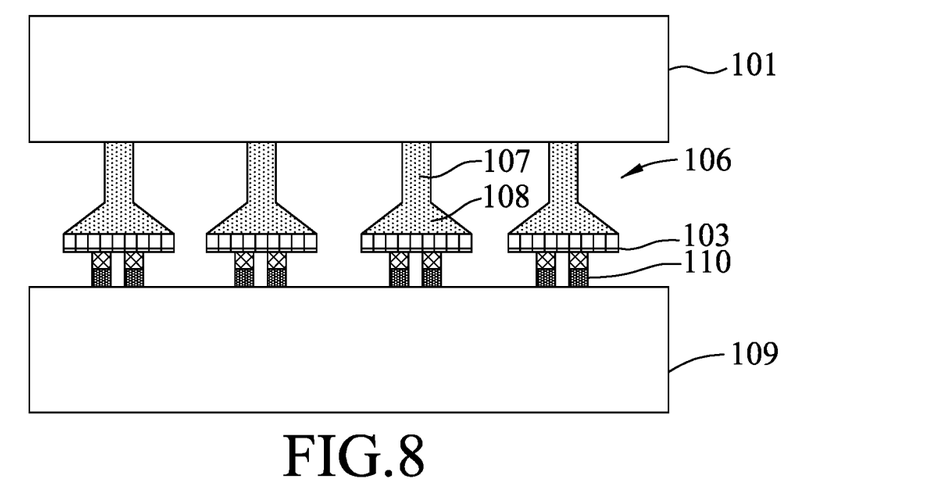
FIG. 8 is a schematic sectional view illustrating step 4 of the embodiment.

In step 4, as shown in FIG. 8, a package substrate 109 and a plurality of metallic support members 110 are provided. The metallic support members 110 are disposed on a surface of the package substrate 109 to correspond in position to the micro semiconductor elements 103. Further in step 4, the metallic support members 110 and the corresponding micro semiconductor elements 103 are subjected to a eutectic process, so that the metallic support members 110 are bonded to and support the corresponding micro semiconductor elements 103.

The metallic support members 110 may be made from a material selected from the group consisting of an AgSnCu alloy, In, a BiSn alloy, and combinations thereof.

The eutectic process may be conducted at a temperature not higher than 300° C. for no more than 1 minute, so that the connecting structures 106 are maintained stable during the eutectic process.

In this embodiment, the metallic support members 110 are respectively bonded to electrodes of the micro semiconductor elements 103 (see FIG. 8) via the eutectic process to support the micro semiconductor elements 103. The electrodes of the micro semiconductor elements 103 may be made from a material selected from the group consisting of Au, In, Sn, a BiSn alloy, and combinations thereof.

Figure 9:
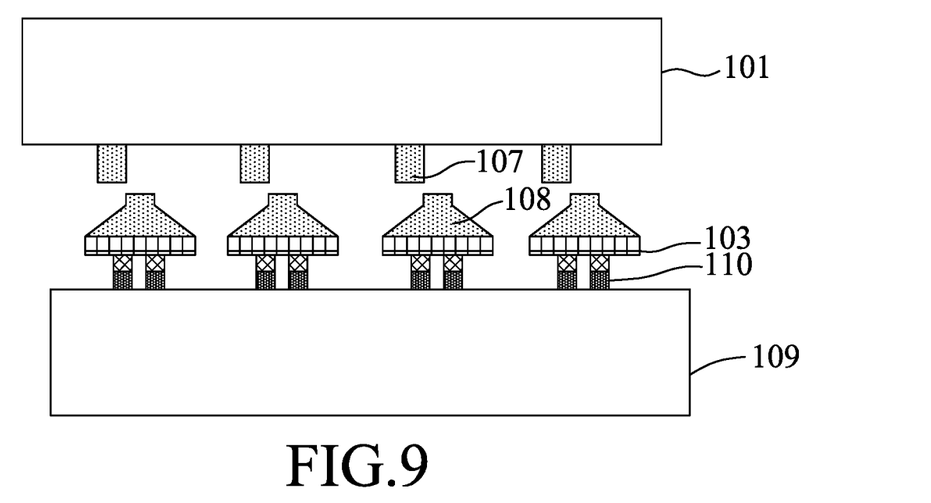
FIGS. 9 and 10 are schematic sectional views illustrating step 5 of the embodiment.
Figure 10:
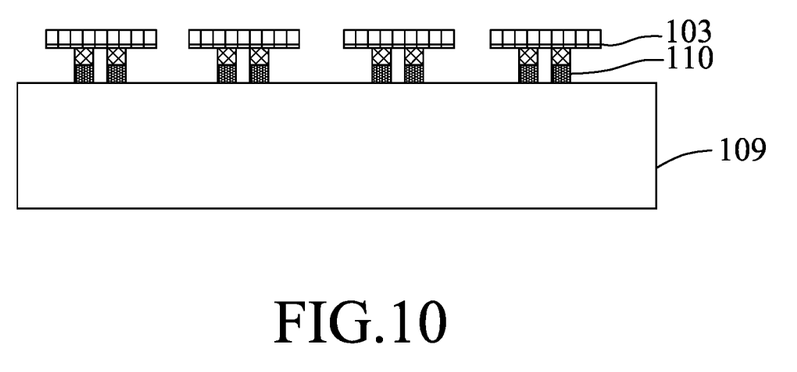

In step 5, the second connecting segments 107 of the connecting structures 106 are broken so as to separate the micro semiconductor elements 103 from the transfer substrate 101 (see FIG. 9), and the remaining connecting structures 106 are respectively removed from the micro semiconductor elements 103 (see FIG. 10). Therefore, the mass transfer of the micro semiconductor elements 103 is achieved.

In this embodiment, the second connecting segment 107 of each of the connecting structures 106 is broken via a mechanical force that is exerted in a force applied direction inclined relative to an extension direction in which the second connecting segment 107 extends. Alternatively, the second connecting segment 107 of each of the connecting structures 106 may be broken via mechanical cutting (or any other applicable approach).

The advantages of the mass transfer method of the present disclosure are described as follows.

First of all, all the micro semiconductor elements 103 can be easily picked up by the photosensitive layer 102 having a sufficiently large surface area, thus dispensing with a high-precision positioning technique and improving the success rate of transfer.

Secondly, in the light exposure process, the micro semiconductor elements 103 per se serve as photomasks, thereby dispensing with an additional photomask and a removal procedure thereof. Accordingly, the cost of mass transfer can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for mass transfer of micro semiconductor elements, comprising:
    providing a transfer unit and a semiconductor carrying unit connected with the transfer unit, the transfer unit including a transfer substrate and a photosensitive layer disposed on the transfer substrate, the photosensitive layer being partially removable, the semiconductor carrying unit including an array of micro semiconductor elements and an element supporting structure that supports the micro semiconductor elements, each of the micro semiconductor elements having a semiconductor layer and at least one electrode disposed on the semiconductor layer opposite to the photosensitive layer, and interconnecting the transfer unit and the element supporting structure in a manner that the semiconductor layer adheres to the photosensitive layer and the electrode is connected to the element supporting structure;
    removing the element supporting structure from the micro semiconductor elements;
    partially removing the photosensitive layer so that remaining portions of the photosensitive layer respectively correspond in position to the micro semiconductor elements and serve as connecting structures, each of which interconnects a respective one of the micro semiconductor elements and the transfer substrate, a width of at least one part of each of the connecting structures being smaller than a width of an upper surface of the semiconductor layer of a corresponding one of the micro semiconductor elements, the upper surface of the semiconductor layer facing away from the corresponding one of the connecting structures;
    connecting a package substrate with the electrodes of the micro semiconductor elements; and
    breaking the connecting structures so as to separate the micro semiconductor elements from the transfer substrate.

2. The method as claimed in claim 1, wherein each of the connecting structures has a first connecting segment that extends from the semiconductor layer of the respective one of the micro semiconductor elements toward the transfer substrate in a first direction, and a second connecting segment that extends from the first connecting segment to the transfer substrate in the first direction, the second connecting segment being not larger in width in a second direction than the corresponding semiconductor layer, the second direction being transverse to the first direction, the second connecting segments of the connecting structures being broken so as to separate the micro semiconductor elements from the transfer substrate.

3. The method as claimed in claim 1, wherein a plurality of metallic support members are disposed on a surface of the package substrate to correspond in position to the electrodes of the micro semiconductor elements, the package substrate being connected with the electrodes of the micro semiconductor elements by:
    subjecting the metallic support members and the corresponding micro semiconductor elements to a eutectic process, so that the metallic support members are bonded to and support the electrodes of the corresponding micro semiconductor elements.

4. The method as claimed in claim 1, wherein the photosensitive layer is in a partially cured state and has adhesiveness.

5. The method as claimed in claim 4, further comprising heating the photosensitive layer in the partially cured state so that the photosensitive layer is further cured.

6. The method as claimed in claim 1, wherein the photosensitive layer is partially removed through a light exposure process where the micro semiconductor elements serve as photomasks, and through a development process.

7. The method as claimed in claim 6, wherein the photosensitive layer is in a partially cured state and has adhesiveness, and is exposed to ultraviolet light in the light exposure process, so that the ultraviolet light travels perpendicularly relative to and strikes the photosensitive layer in the partially cured state to have each of the connecting structures symmetrically formed after the development process.

8. The method as claimed in claim 2, further comprising, after breaking the second connecting segments of the connecting structures, removing the remaining connecting structures respectively from the micro semiconductor elements.

9. The method as claimed in claim 2, wherein the first connecting segment of each of the connecting structures has a trapezoidal section, and the second connecting segment of each of the connecting structures is a pillar.

10. The method as claimed in claim 9, wherein, for each of the connecting structures, the trapezoidal section of the first connecting segment has a narrow base that is connected to the second connecting segment, and a wide base that is opposite to the narrow base and connected to the semiconductor layer of a corresponding one of the micro semiconductor elements, and that is wider in the second direction than the narrow base, the width of the second connecting segment is not larger than the narrow base of the trapezoidal section of the corresponding first connecting segment.

11. The method as claimed in claim 1, wherein the photosensitive layer is made from a photosensitive material selected from the group consisting of poly(methyl methacrylate) (PMMA), polydimethylsiloxane (PDMS), polyimide (PI), and combinations thereof.

12. The method as claimed in claim 11, wherein the element supporting structure includes a supporting layer and a plurality of stabilization posts that protrude away from the supporting layer, the micro semiconductor elements being respectively disposed on the stabilization posts opposite to the supporting layer.

13. The method as claimed in claim 2, wherein the second connecting segment of each of the connecting structures is broken via a mechanical force that is exerted in a force applied direction inclined relative to the first direction in which the second connecting segment extends.

14. A device for mass transfer of micro semiconductor elements, comprising:
    a transfer substrate;
    an array of connecting structures; and
    an array of micro semiconductor elements, each of which has a semiconductor layer and at least one electrode disposed on said semiconductor layer,
    wherein each of said connecting structures interconnects a respective one of said micro semiconductor elements and said transfer substrate, said electrode being disposed on said respective semiconductor layer opposite to a corresponding one of said connecting structures, each of which interconnects a respective one of said micro semiconductor elements and said transfer substrate, a width of at least one part of each of said connecting structures being smaller than a width of an upper surface of said semiconductor layer of a corresponding one of said micro semiconductor elements, said upper surface of said semiconductor layer facing away from said corresponding one of said connecting structures.

15. The device as claimed in claim 14, wherein each of said connecting structures has a first connecting segment that extends from said semiconductor layer of said respective one of said micro semiconductor elements toward said transfer substrate in a first direction, and a second connecting segment that extends from said first connecting segment to said transfer substrate in the first direction, said second connecting segment being not larger in width in a second direction than said corresponding semiconductor layer, the second direction being transverse to the first direction.

16. The device as claimed in claim 14, wherein each of said connecting structures is made from a photosensitive material, and is in a partially cured state or a fully cured state.

17. The device as claimed in claim 14, wherein each of said connecting structures is made from a photosensitive material selected from the group consisting of poly(methyl methacrylate) (PMMA), polydimethylsiloxane (PDMS), polyimide (PI), and combinations thereof.

18. The device as claimed in claim 15, wherein said first connecting segment of each of said connecting structures has a trapezoidal section, and said second connecting segment of each of said connecting structures is a pillar.

19. The device as claimed in claim 18, wherein, for each of said connecting structures, said trapezoidal section of said first connecting segment has a narrow base that is connected to said second connecting segment, and a wide base that is opposite to said narrow base and connected to said semiconductor layer of a corresponding one of said micro semiconductor elements, and that is wider than said narrow base, said width of said second connecting segment being not larger than said narrow base of said trapezoidal section of said corresponding first connecting segment.

20. The device as claimed in claim 14, wherein said micro semiconductor elements are selected from the group consisting of micro light emitting diodes, micro photodiodes, micro metal oxide semiconductors, microelectromechanical systems, micro semiconductor laser diodes, micro transistors, micro solid-state image sensing devices, micro light emitters and receivers for photocouplers, microprocessor units, micro integrated circuits, micro thyristors, and combinations thereof.

* * * * *